United States Patent [19]

Shanks

[11] 4,127,848

[45] Nov. 28, 1978

[54] LIQUID CRYSTAL WAVEFORM DISPLAYS

[75] Inventor: Ian A. Shanks, Malvern, England

[73] Assignee: National Research Development Corporation, London, England

[21] Appl. No.: 737,794

[22] Filed: Nov. 1, 1976

[30] Foreign Application Priority Data

Nov. 5, 1975 [GB] United Kingdom ............... 45957/75

[51] Int. Cl.² .............................................. G06F 3/14
[52] U.S. Cl. ......................... 340/324 M; 340/166 EL; 350/333
[58] Field of Search ....... 340/324 R, 324 M, 166 EL, 340/336; 350/160 LC

[56] References Cited

U.S. PATENT DOCUMENTS

| | | | |
|---|---|---|---|
| 2,817,815 | 12/1957 | Evans | 340/324 R |
| 3,130,348 | 4/1964 | Lieb | 340/324 R |
| 3,878,537 | 4/1975 | Roncillat et al. | 340/324 M |
| 3,938,134 | 2/1976 | Hackstein et al. | 340/324 M |

*Primary Examiner*—Marshall M. Curtis
*Attorney, Agent, or Firm*—Cushman, Darby & Cushman

[57] ABSTRACT

An electronic analogue waveform display comprises a liquid crystal cell having $x$, $y$ electrodes whereby the cell is addressed in a matrix manner by applying electric potentials of about zero at required $x$, $y$ intersections and above a threshold voltage at all other intersections. A waveform to be displayed is divided into a series of amplitude samples and electrical potentials representative of these samples are applied to the $x$, $y$ electrodes while a series of electric potentials are applied to $x$ electrodes. Rectangular or sinusoidal waveforms may be applied to the $x$, $y$ electrodes. Various circuits for producing a display are disclosed.

9 Claims, 11 Drawing Figures

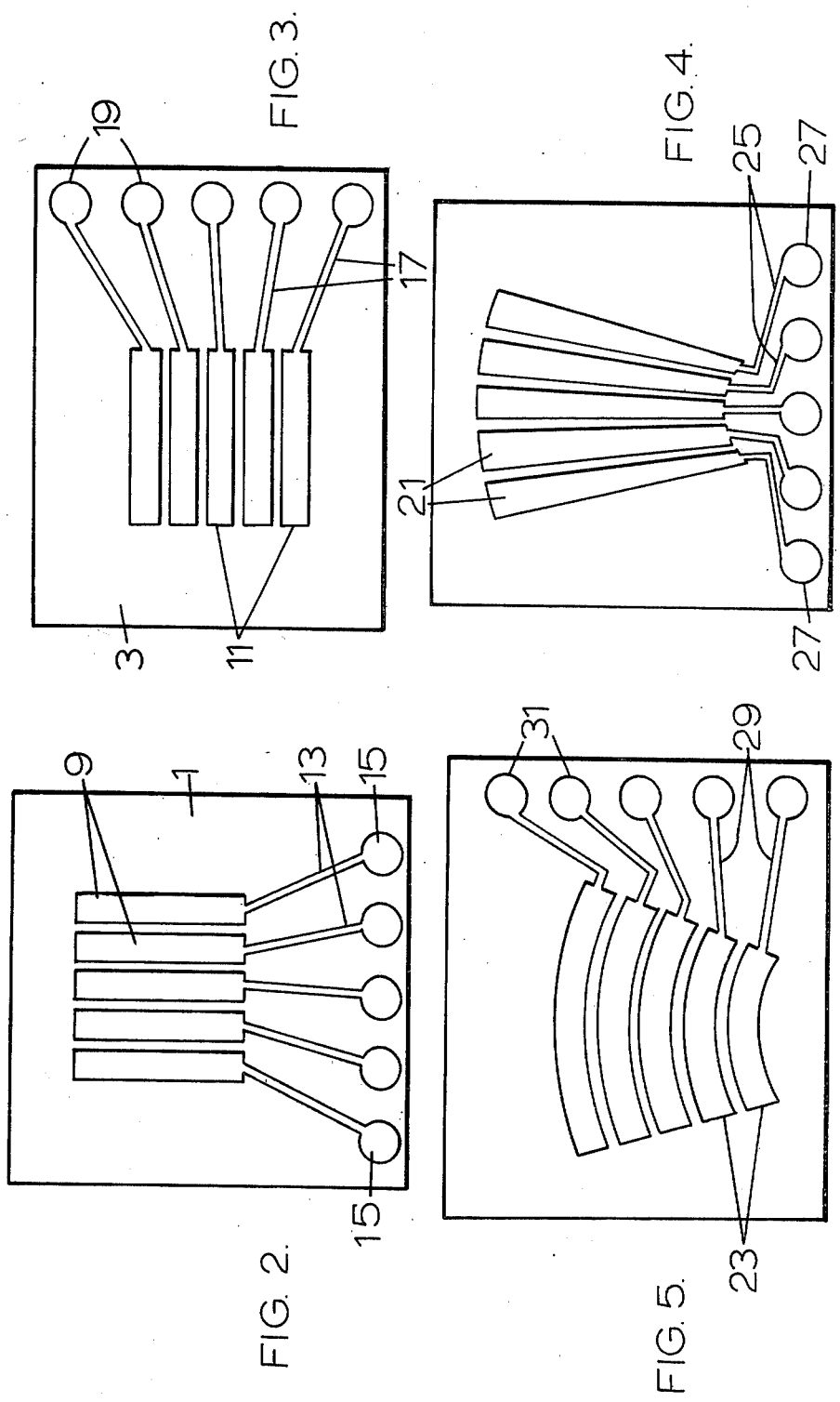

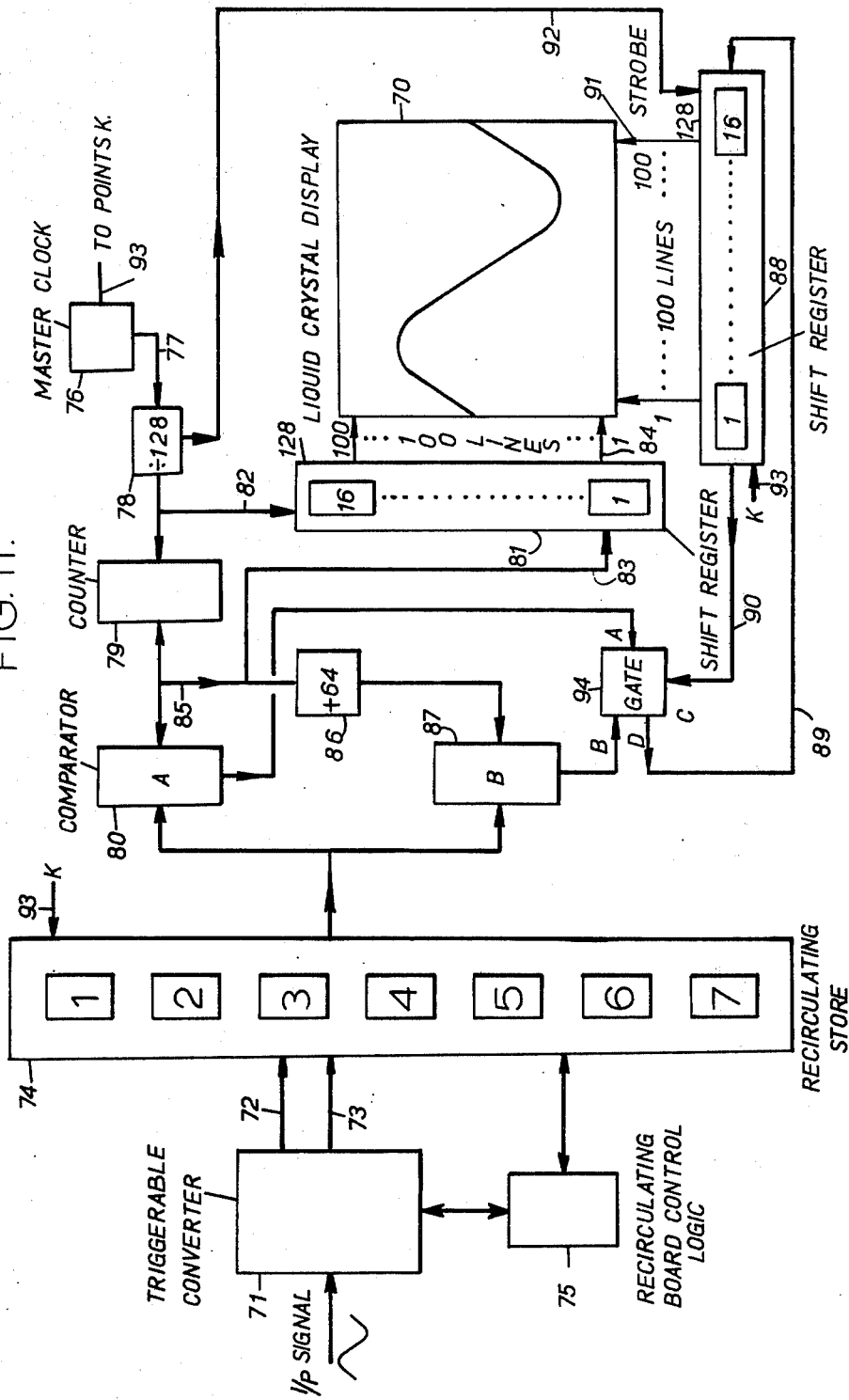

LIQUID CRYSTAL WAVEFORM DISPLAYS

The present invention relates to electronic analogue waveform displays.

Because of their potential simplicity, compactness, cheapness and lower voltage and power consumption liquid crystal devices are replacing conventional devices such as cathode ray tubes in many electronic display applications. However cathode ray tubes are still dominant in analogue waveform display applications.

The purpose of the present invention is to provide an analogue waveform display incorporating a liquid crystal display device. The basic part of a liquid crystal display device is the liquid crystal display cell which comprises a pair of dielectric substrates, at least one of which is optically transparent, one or more electrodes on the inner surface of each substrate and a thin layer of liquid crystal material sandwiched between the substrate inner surfaces and the electrodes. When an electric field above a threshold voltage is applied between the electrodes on the respective inner surfaces the field causes a 'display effect' to occur: a molecular re-alignment is produced in the liquid crystal layer between the electrodes affecting some optical property, eg transparency of the layer. The region affected by the field appears different from regions having no field applied. Thus a display 'element' or 'character' defined by the shape and size of the electrodes exists between the electrodes. The element is either 'on' or 'off' depending on whether the electric field is or is not applied.

One known kind of liquid crystal display cell is the 'intersection' kind in which elongated or strip electrodes on the two substrate inner surfaces are arranged to intersect at an array of regions of the liquid crystal layer defining an array of display elements. For example, the electrodes on one inner surface may be in the form of horizontal strips defining rows of elements: the electrodes on the other inner surface may be arranged in the form of vertical stripes defining columns of elements. The array of elements is thus a rectangular row and column matrix.

According to the present invention an electronic analogue waveform display includes a sampler for dividing the waveform to be displayed into a series of amplitude samples, a plurality of converters, one for each amplitude sample, each for producing an electrical potential representative of its amplitude sample, a liquid crystal cell of the intersection kind defined above, a plurality of first driver devices each connected between a separate converter and a separate electrode on one of the cell substrates for applying to its electrode an electrical potential representative of the output of its converter, and a plurality of second driver devices for applying a series of electrical potentials to the electrodes on the other cell substrate such that a rms voltage greater than a display effect threshold voltage exists across some liquid crystal elements of the cell so that these elements are in their on state and a rms voltage of zero or less than the display effect threshold voltage exists across other elements so that these elements are in their off state and collectively display the analogue waveform.

For example, electrical potentials which are rectangular or sinusoidal waves of equal amplitude may be applied to all of the electrodes, the phase, frequency or mark/space ratio (for rectangular waveforms only) of the waveforms differing on every electrode except on electrodes intersecting at elements selected by the driver devices to be in the off state. Preferably, the potentials applied by the second driver devices have a phase, frequency or mark space ratio which varies in steps from one electrode to the next. This causes the positions of the 'off' elements to be determined solely by the converter outputs.

If the electrode potentials are rectangular waves of equal amplitude, frequency and mark space ratio but different phase the converters may comprise a cascade of parallel comparators each feeding a separate bistable device. Each comparator compares its input from the sampler with a time varying reference voltage, eg a staircase or sawtooth waveform, and produces an output at a time dependent on the magnitude of the input from the sampler. This produces a rectangular wave potential at the bistable device output whose phase is linearly dependent on the magnitude of the potential at the corresponding sample output.

Alternatively the sampler and converters may be digital devices. For example, amplitude samples may be written as a series of digital numbers by a shift register into a cascade of counters. Pulses from a common clock are then applied to the counters to cause each counter to provide an output square wave whose phase is dependent on the digital number written in the counter.

The sampler may comprise a cascade of parallel electronic gates and RC circuits. The gates are opened in sequence to allow storage at each capacitor of a potential determined by the magnitude of the analogue waveform when the corresponding gate is opened.

Preferably, a digital or analogue memory, eg a random access memory, is connected to the input terminal of the sampler to provide a permanent record of the waveform displayed.

The driver elements may be conventional transistor amplifiers, switches or optoelectronic addressing elements as described in copending U.K. Pat. application No. 24556/73.

The liquid crystal elements may be arranged in a rectangular matrix as described above so that the analogue waveform is displayed in Cartesian co-ordinates. Alternatively, the electrodes on one substrate may be in the form of diverging radii (not touching) and those on the other substrate may be in the form of arcs of progressively increasing radius so that the analogue waveform is displayed in polar co-ordinates.

The display effect exhibited by the liquid crystal elements in the on state may be the so-called 'phase change' effect in which the phase of the liquid crystal material is converted from cholesteric to nematic (cloudy or coloured to clear) by the action of a voltage. The liquid crystal material may be dyed with a dissolved dichroic dye to enhance the effect.

Alternatively, the effect may be the so-called 'twisted nematic' effect in which the molecules of the liquid crystal layer are arranged in the off state in a helical twist from one substrate inner surface to the other by previous known treatment of the surfaces and in which the molecules are re-aligned in the on state to lie parallel to the applied electric field. A twisted nematic effect liquid crystal device needs to be sandwiched between a polariser and an analyser in a known way in order to observe the change in optical activity (optical rotation of polarised light) resulting from the molecular re-alignment.

Alternatively, the effect may be the Freedericksz, memory, dynamic scattering or any other liquid crystal electro-optic effect.

The threshold voltage for some effects, eg the phase change effect, is well defined but that for others, eg the twisted nematic effect, is not. In the case of an effect having a threshold voltage which is not well defined the 'display effect threshold' referred to above is to be understood to include any convenient part of the curve of optical response versus voltage, eg optical activity or transmission versus voltage curve in the case of the twisted nematic effect, where the optical response has changed from the off state value.

Embodiments of the present invention will now be described by way of example with reference to the accompanying drawings, in which:

FIGS. 2 to 5 are front views of glass slides illustrating different electrode configurations for the cell shown in FIG. 1;

FIGS. 9, 10 and 11 are schematic circuit diagrams illustrating different ways of generating electrical potentials to display an analogue waveform.

Figure 1:
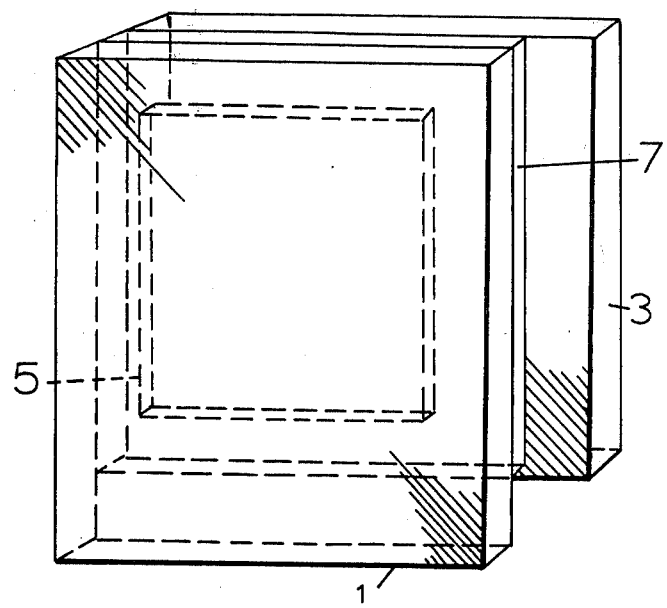
FIG. 1 is a perspective view of a liquid crystal display cell suitable for use in connection with the invention.

The cell shown in FIG. 1 comprises a rectangular glass slide 1 whose height is greater than its length and a rectangular glass slide 3 whose length is greater than its height. A layer 5 of liquid crystal material is sandwiched between the slides 1 and 3 in a known way and a spacer 7 of an inert plastics material, eg Mylar (Trade Mark), encloses the edges of layer 5.

The liquid crystal material employed in the layer 5 depends on the desired liquid crystal effect; but for the twisted nematic effect for instance the material may be one of the cyanobiphenyl compounds described in United Kingdom Pat. application 51698/72, eg 4'-n-alkyl- or -alkoxy-4-cyanobiphenyl having 3 to 8 carbon atoms in the alkyl or alkoxy group or a multi-component solution containing such compounds, eg the following solution

| | |
|---|---|
| n-C$_7$H$_{15}$—⌬—⌬—CN | 48% by weight |
| n-C$_5$H$_{11}$O—⌬—⌬—CN | 20% by weight |
| n C$_7$H$_{15}$O—⌬—⌬—CN | 22% by weight |
| n-C$_5$H$_{11}$—⌬—⌬—⌬—CN | 10% by weight |

For the phase change effect the material may be one of the above compounds or the above mixture, together with a few percent by weight of an appropriate optically active material such as cholesteryl nonanoate or one of the cyanobiphenyl compounds described in U.K. Pat. application No. 36211/75. Phase change effect material may be dyed with a few percent by weight of a known suitable dye, eg one of the dyes described in United Kingdom Pat. application Nos. 25843/75 and 25859/75 such as the dye:

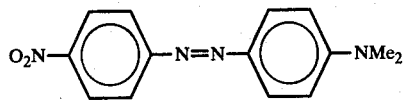

The slides 1 and 3 have electrodes deposited on their inner surfaces but for clarity these are not shown in FIG. 1.

FIGS. 2 and 3 illustrate one possible electrode configuration. A series of vertical conducting strips 9 on the slide 1 faces a series of horizontal conducting strips 11 on the slide 3 defining a rectangular matrix of liquid crystal elements (not shown) at the intersections. The strips 9 are each connected by narrow leads 11 to terminals 15 on an end of the slide 1 overlapping the slide 3.

The strips 11 are similarly connected by leads 17 to terminals 19 on an end of the slide 3 overlapping the slide 1.

FIGS. 4 and 5 illustrate an alternative possible electrode configuration. A series of conducting radial strips 21 on the slide 1 face a series of conducting arc-shaped strips 23 of increasing diameter on the slide 3 defining at the intersections of the two series liquid crystal elements (not shown) arranged in a polar co-ordinate array. The strips 21 are each connected by narrow leads 25 to terminals 27 on the end of the slide 1 overlapping the slide 3, whilst the strips 23 are each connected by narrow leads 29 to terminals 31 on the end of the slide 3 overlapping the slide 1.

All of these electrode configurations may be formed in a conventional way by depositing a film (typically 500 Å thick) of tin or indium oxide on the slide and etching the film by photolithography as used in integrated circuit manufacture.

Figure 6:
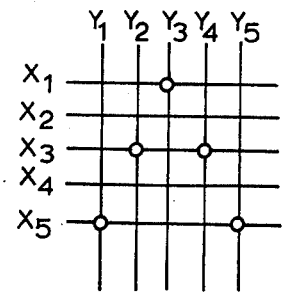
FIGS. 6 and 7 are circuit 'intersection' diagrams illustrating possible waveforms displayed by the cell shown in FIG. 1.
Figure 7:
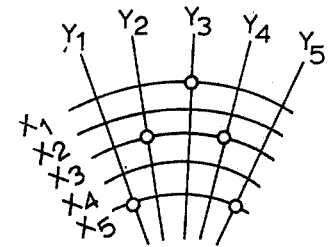

FIGS. 6 and 7 are circuit intersection diagrams illustrating in a simplified way the liquid crystal elements obtained at intersections of the electrode configurations of FIGS. 2 and 3 and of FIGS. 4 and 5 respectively. As explained above in this invention an analogue waveform is displayed by liquid crystal elements in their off state, and FIGS. 6 and 7 show one possible waveform, in Cartesian and polar co-ordinates respectively. Elements in the off state are represented by rings. The other elements shown are in their on state.

Although each of the slides is shown in FIGS. 2 to 5 for simplicity as having only five electrode strips providing a 5 by 5 array of elements as shown in FIGS. 6 and 7, the number of strips may in practice be much larger, eg 100 providing b 10$^4$ liquid crystal elements, or even more, enabling the display of an analogue waveform to be better resolved.

For the following analysis the strips on the slide 1, eg the vertical strips 9 of FIG. 2 or the radial strips 21 of FIG. 4, will be referred to as Y electrodes, viz $Y_1$, $Y_2$, ... $Y_m$, as labelled in FIGS. 6 and 7, where m is the number of Y electrodes. The strips on the slide 3, eg the horizontal strips 11 of FIG. 3 or the arc-shaped strips of FIG. 5, will be referred to as X electrodes, viz $X_1$, $X_2$ ... $X_m$, as labelled in FIGS. 6 and 7, where m is also the number of X electrodes.

Electrical potentials may be applied in one of the following ways to achieve representation of an analogue waveform by liquid crystal elements in the off state.

A series of periodic rectangular-wave electrical potentials $V_1$, $V_2$ ... $V_m$ is generated, as described below.

These potentials have identical amplitude $V_o$, mark-space ratio, and frequency f but differ in relative phase by $2\pi/m$ radians. Thus $V_1$ has a phase of zero, $V_2$ a phase of $2\pi/m$ radians, $V_3$ a phase of $4\pi/m$ radians, ... $V_m$ a phase of $(m-1)2\pi/m$ radians.

The potential $V_1$ is applied continuously to electrode $X_1$, $V_2$ is applied continuously to $X_2$ and so on ... $V_m$ to $X_m$. The phase of the potential $V_o$ applied to each Y electrode depends on the amplitude of the analogue waveform to be displayed at the Y co-ordinate defined by that Y electrode. Suppose that the analogue waveform shown in FIGS. 6 and 7 is to be displayed using rectangular waveform of equal mark space ratio i.e. square waves. This means that elements having the following co-ordinates are to be in their off state: $X_5$, $Y_1$; $X_3$, $Y_2$; $X_1$ $Y_3$; $X_3$ $Y_4$; and $X_5$ $Y_5$. Since zero voltage is required at these elements the phases of the potentials on the Y electrodes must equal those on the X electrodes which intersect with the Y electrodes at these elements.

Thus the potentials on electrodes $Y_1$ to $Y_5$ are respectively $V_5$, $V_3$, $V_1$, $V_3$ and $V_5$. Every other element is put into the on state as follows.

If the phase of the potential applied to any X electrode is not equal to that applied to any Y electrode then a voltage $V'(t)$ exists at the elements where the electrodes intersect. The voltage $V'(t)$ is a periodic rectangular wave having a pulse width depending on the degree to which the two potentials are out of phase. The voltage $V'(t)$ will be at a minimum when the phase differences is $2\pi/m$.

It is desirable to calculate the rms value of this voltage $V'\min(t)$ since this rms value will be the minimum effective voltage at the liquid crystal elements and the minimum effective voltage is required to put liquid crystal elements into their on state.

The mean square value M of any periodic voltage having a period $\tau$ is given by:

$$M = \frac{1}{\tau} \int_0^T V^2 dt \quad \text{Equation (1)}$$

where V is the voltage as a function of time t.

Figure 8:
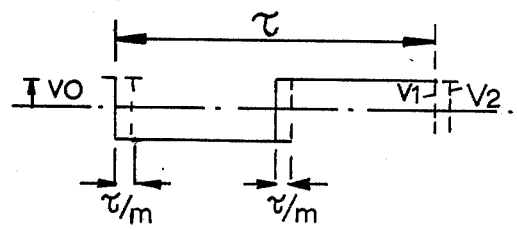
FIG. 8 is a sketch illustrating two waveforms.

FIG. 8 shows two waveform potentials $V_1$ and $V_2$ which are separated by the minimum phase spacing $2\pi/m$ radian and which give rise to $V_{min}$. The potenial $V_1$ is shown by a full line and the potential $V_2$ is shown by a dashed line. The two potentials differ by a value $2V_o$ for a time $\tau/m$ at the beginning of each half-period $\tau/2$ and are equal everywhere else. Therefore in the case where V in Equation 1 is $V'\min(t)$ the integral on the right hand side of Equation 1 becomes:

$$\int_0^T V^2 dt = \int_0^T V'_{min} dt = (2V_o)^2 2\frac{\tau}{m} = 8V_o^2 \frac{2\tau}{m} \quad \text{Equation (2)}$$

Substituting Equation (2) in Equation (1) the mean square value $M_{min}$ of the minimum voltage $V'_{min}$ is given by:

$$M_{min} = \frac{8V_o^2}{m} \quad \text{Equation (3)}$$

Thus the minimum root mean square value $V_{rms(min)}$ is:

$$V_{rms(min)} = \sqrt{M_{min}} = \frac{2\sqrt{2V_o}}{\sqrt{m}} \quad \text{Equation (4)}$$

Thus if m is 5, $V_{rms(min)} = 2\sqrt{2}V_o/\sqrt{5} \approx 1.3 V_o$.
If m is 100 $V_{rms(min)} = 2\sqrt{2}V_o/10 \approx 0.3 V_o$.

The liquid crystal display effect threshold $V_c$ needs to be less than, preferably half, this minimum rms voltage $V_{rms(min)}$ so that the appropriate elements are put into the on state.

Thus, $V_c$ is preferably given by:

$$V_{rms(min)} = 2V_c \quad \text{Equation (5)}$$

giving $$V_o = \frac{\sqrt{m'} V_c}{\sqrt{2}} \quad \text{Equation (6)}$$

For a phase change effect $V_c$ is typically 10 Volts. Thus, for a 100 × 100 line element array $V_o$ is preferably about 70 Volts.

Similarly for a twisted nematic effect $V_c$ is typically 1.2 Volts. Thus for a 100 × 100 array $V_o$ is preferably about 8.5 Volts.

In the above method the phase steps between the X electrode potentials need not necessarily be $2(\pi/m)$. For example two sets of phases which vary in $\pi/m$ steps may be used. Similarly the mask-space ratio need not be in unity.

Examples of circuits for applying potentials according to the above method are described below with reference to FIGS. 9, 10 and 11.

A second method of applying electrical potentials involves the use of a series of sine waves $V_1, V_2 ... V_m$ which are out of phase with each other instead of the rectangular waves described above. The sine waves are applied in the same general way, although a different relationship between $V_o$ and $V_c$ will exist in this case.

A third method involves the use of a series of sine or rectangular waves $V_1^1, V_2^1 ... V_m^1$ having equal phase and amplitude but different frequencies, varying in steps (preferably of about 50Hz) eg in or over the range 50Hz to 10kHz. These are applied continuously to the X electrodes in a sequence, ie $V_1^1$ to $X_1$, $V_2^1$ to $X_2 ... V_m^1$ to $X_m$.

Potentials of the same series are applied to the X electrodes but for the Y electrodes the potentials are selected according to the amplitude of the analogue waveform they represent. Thus, if an element having the co-ordinates $X_5$ and $Y_1$ for instance is to be put into the off state to display part of the analogue waveform the potential applied to the electrode $Y_1$ is $V_5^1$ so that zero potential difference exists at the element. At elements not required to be in the off state a frequency difference will exist between the potentials applied to the X and Y electrodes. This frequency difference gives rise to a residual voltage, and the minimum residual voltage must be greater than $V_c$ preferably twice $V_c$.

For this third method the Y electrodes may be energised by conventional drivers controlled by devices (not shown) which provide synchronous voltage to frequency conversion. The X electrodes may be energised by conventional drivers controlled by a plurality of 'divide by $n$' counters and a common clock to provide X electrode potentials which successively differ in frequency by fixed amounts.

A fourth method involves the use of a series of rectangular waves having equal phase, frequency and amplitude but different pulse width, ie mark/space ratio. In the same way as described above the elements required to be off have zero voltage across them, here by applying potentials of the same pulse width to the appropriate X and Y electrodes, whilst the elements required to be on have a residual voltage by applying potentials of different pulse width to their X and Y electrodes. Again, the minimum residual voltage is preferably greater than $2V_c$.

For this fourth method the Y electrodes may be energised by conventional drivers under the control of monostable or astable multivibrators which produce a rectangular waveform having a mark-space ratio linearly dependent on the input voltage. The X electrodes may be energised by conventional drivers each controlled by a separate shift register and common clock to provide potentials which are square waves whose mark-space ratio varies in steps from one X electrode to the next.

Figure 9:
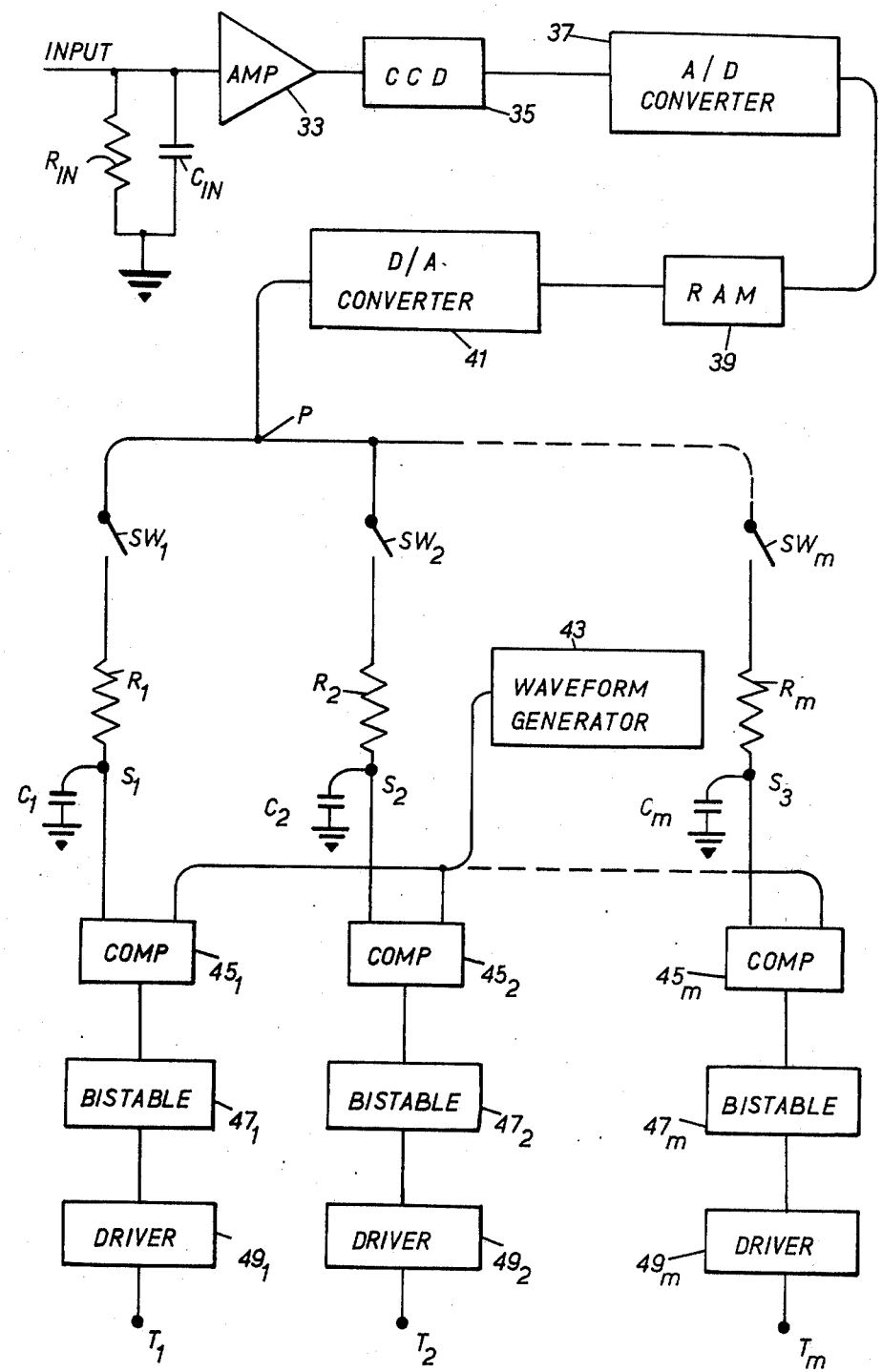

One example of a circuit for producing a series of square waves having equal amplitude, frequency and pulse width but phase dependent on the amplitude of the analogue waveform to be displayed is shown in FIG. 9. The circuit can be considered in two parts: the first extends from the input, where an analogue waveform to be displayed is applied as a time varying electrical potential, to a point P. The second is from the point P to the liquid crystal cell Y electrode terminals denoted as $T_1, T_2 \ldots T_m$, eg terminals 19 shown in FIG. 3 or terminals 31 shown in FIG. 5. The first part of the circuit is a single common channel which records the incoming waveform and converts it into a form suitable for response by the second part. The second part contains the same number of channels as the number $m$ of Y electrodes and each channel samples a different fraction $(1/m)$ of the analogue waveform (in a given time) and produces the required output.

In the first part of the circuit the incoming waveform is applied to a variable gain amplifier 33 having an input impedance determined by a resistor $R_{IN}$ (typically 1MΩ) and a capacitor $C_{IN}$ (typically 30pF) connected in parallel between the input to the amplifier 33 and earth. The amplifier 33 is provided to scale the incoming waveform up or down (manually) so that the waveform has an appropriate height for display by the liquid crystal cell.

The output of the amplifier 33 is applied in turn to a charge coupled device (CCD) 35, the analogue to digital (A/D) converter 37, a random access memory (RAM) 39 and a digital to analogue (D/A) converter 41.

The CCD acts as a sampling time expander by clocking in samples of the waveform at a first rate e.g. several MHz - several 100MHz, until the CCD is full with a number $m$ of amplitude samples i.e. equal to the number of Y electrodes to be addressed. Input to the CCD is then stopped and the waveform samples clocked out at a slower rate e.g. several hundred kHz suitable for handling by the A/D converter 37 and RAM 39.

After A/D conversion into a binary number each waveform sample is stored in RAM 39 which has $m$ storage cells. The binary output of the RAM is converted back into a number of analogue voltage amplitude samples by the D/A converter 41.

Each channel of the second part of the circuit comprises an electronically operated gate SW, e.g. a MOS bilateral gate, a resistor R (typically 1kΩ) and a capacitor C (typically 500pF) connected between the resistor R and earth, a comparator 45 having one input from the common point denoted as S between the capacitor C and resistor R and another input from a fixed waveform generator 43. Each comparator 45 preferably has an input impedance of 1MΩ or more. Each channel also comprises a bistable device 47 connected to the output of the comparator 45 and a driver 49. The reference symbol subscripts shown in the second part of the circuit in FIG. 8 denote the Y electrodes to which the various channels are connected.

The gates SW are clocked open in sequence, e.g. by a shift register signal (not shown). In other words $SW_1$ is clocked open first then $SW_2$ and so on, each for a fraction $(1/m)$ of the time T taken to read out the m samples in the RAM 39. A potential is therefore developed at each point S which represents the potential of each analogue waveform sample reconstructed by the D/A converter 41 when the corresponding gate SW is open. This potential remains at S for a time arranged to be considerably longer than T. Each comparator 45 compares this potential with a conventional fixed sawtooth or staircase potential (preferably the latter) from the waveform generator 43. At some point in time the difference between the potential from each point S and the potential on the fixed waveform will change sign causing each comparator 45 to give a corresponding output pulse which lasts until the end of each staircase waveform. Thus each comparator 45 gives an output pulse whose leading edge is a measure in time of the amplitude of the potential at the point P. Furthermore if the fixed waveform is a staircase waveform of frequency $2f$ the comparators 45 will give a rectangular pulsed output of frequency $2f$. The bistable devices 47 convert the rectangular pulsed output into a square wave of frequency $f$ since one pulse from a comparator 45 puts the corresponding bistable device 47 into its '1' state and the next puts it into its '0' state and so on.

The drivers 49 are conventional voltage amplifying devices. The outputs from the bistable devices 47 have peak-to-peak amplitudes of typically a few volts, whereas the amplitudes required to be applied to the liquid crystal Y electrodes is higher as explained above. The drivers 49 are for example conventional transistor gates which are opened and closed with a frequency f by the square wave from the bistable devices 47. When open the drivers 49 in the form of gates connect their respective terminals T to an electrical potential source (not shown), e.g. of 70 volts, so that the potentials of the terminals alternate in square wave fashion with a fixed frequency $f$, a fixed amplitude determined by the potential source and a variable phase determined by the analogue waveform to be displayed as provided by the comparators 45.

When the circuit shown in FIG. 9 is used to derive the Y electrode potentials the X electrode potentials are preferably derived as a series of square waves whose phase differs in equal steps of $2\pi/m$ from one X electrode to the next. Preferably the X electrodes are energised by drivers (not shown) each of which is simply controlled by an individual output of a parallel output shift register along which a control signal square wave is clocked at a frequency mf synchronously with the increments of the staircase waveform.

For input waveforms having a low frequency, e.g. 20kHz, the CCD 35 may be by-passed by connecting the amplifier 33 directly to the A/D converter 37. Preferably a manual switch (not shown) is provided allowing an operator to select whether or not the CCD 35 is to be by-passed.

For increased frequency the single CCD 35 may be replaced by a cascade of parallel CCDs (not shown) each with its own input and output gates. The input gates are much faster (e.g. 1GHz) than the CCDs. By clocking the input gates open in sequence and the output gates open in sequence a given waveform may be sampled fractionally be multiplexing each CCD in turn thus effectively multiplying the CCD detection bandwidth by the number of CCDs in the cascade. In an alternative circuit the CCD 35 may be replaced by an alternative shift register, e.g. a serial/analogue memory, e.g. a Reticon (Trade Mark) SAM 128V.

It is possible in the case of a repetitive input waveform to apply the output of the amplifier 33 directly to the point P. However this prevents storage of the waveform. In the case of an unrepetitive waveform the storage is highly desirable to allow the waveform to be displayed for a relatively long period, eg in order to allow photographs of the displayed waveform to be taken.

The storage described with reference to FIG. 9 is digital. As such it has the advantages of being permanent and non-destructive. Furthermore, portions of the waveform preceding or following a displayed portion may be selected for display by accessing the RAM 39 differently. Parts of the displayed waveform may be marked in time, eg by flashing, and this can provide the display with an accurate time measurement.

The storage may alternatively be analogue. However since analogue stores usually employ capacitors which cannot store information in the form of charge indefinitely they do not usually provide a permanent record of the waveform.

Figure 10:
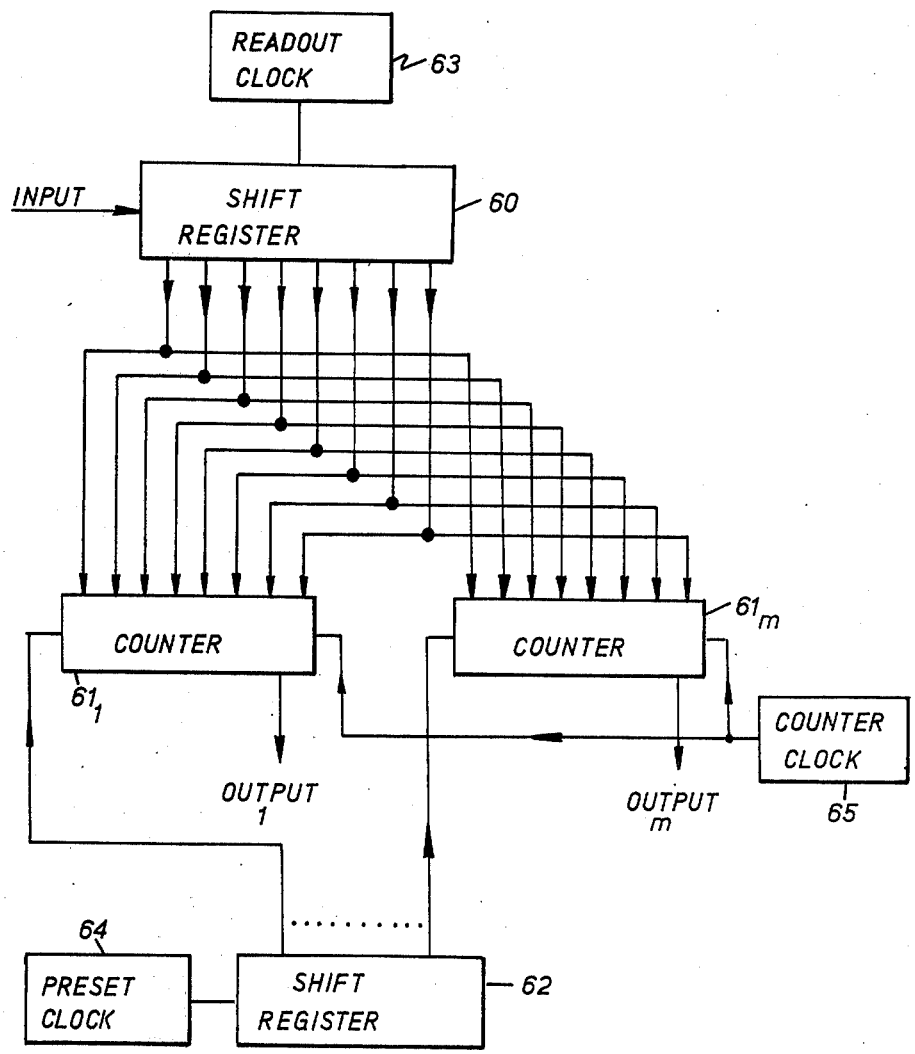

A second example of a circuit for producing a series of square waves having equal amplitude, frequency and pulse width but a relative phase dependent on the amplitude of the analogue waveform to be displayed is shown in FIG. 10. The circuit replaces the part of the circuit shown in FIG. 9 between the RAM 39 and the drivers 49 (exclusive). The output of the RAM 39 (FIG. 9) consists of a series of 8-bit numbers each representative of a waveform amplitude sample. These numbers are fed by a readout clock 63 one-by-one through a serial in/parallel out 8-bit shift register 60 to a series of 8-bit counters $61_1 \ldots 61_m$ ($61_1$ and $61_m$ only shown). As described above the number m is determined by the number of Y electrodes but preferably m is 256 in this particular case to match the binary electronics.

The counters 61 are clocked open in sequence, ie $61_1$ first, then $61_2$ and so on by shifting a '1' pulse along a serial in/parallel out shift register 62 having m parallel outputs each connected to a separate one of the counters 61. The counters 61 only store digits from the shift register 60 when they are clocked open. Thus a distinctive 8-bit sample is stored in each of the counters 61.

The shift register 62 is controlled by a pre-set clock 64 also derived from the RAM 39.

When the counters 61 have all been pre-set in this way the pre-set clock 64 is disconnected. A counter clock 65 connected to each counter 61 is then set running. This produces square waves at a frequency 128 times the desired liquid crystal drive frequency $f$. For each positive going pulse of the square wave the counters 61 which are now all open count one digit. Thus the counters 61 add the digits from the clock 65 to the binary number already stored in them. When this sum reaches $2^7$, ie 128, each counter 61 produces a '1' as its eighth or most significant digit. This eighth digit remains as a '1' until a further 128 digits from the clock 65 have been counted after which this digit becomes '0', and so on.

Thus the output at the eighth digit position of each counter 61 is a square wave which has a frequency $f$. Furthermore the phase of the square wave is determined by the binary number pre-set into the counter 61. Thus 256 outputs are obtained from the 256 counters 61 consisting of square waves whose phases are determined by corresponding distinctive amplitude samples of the waveform to be displayed. The respective outputs from the counters 61 are applied to the drivers 49 (FIG. 9) to energise the liquid crystal Y electrodes.

Most of the facilities obtained with conventional oscilloscopes may be provided with the liquid crystal waveform displays described above. The following are examples.

Intensity (Z) modulation of the displayed waveform may be accomplished by varying the amplitude of the potential applied to the Y electrodes so that a residual voltage of specified amplitude is left at the liquid crystal elements which previously had zero voltage applied. If this residual voltage is greater than the threshold voltage $V_c$ then each selected element can have any optional state between full off and fully on depending on the magnitude of the residual voltage. Alternatively the phase, frequency or mark-space ratio of the applied Y electrode potentials may be altered or periodically switched or modulated to give intensity modulation or to flash a selected element.

Dual trace operation may be achieved by designating every even numbered Y electrode and its electronics to one input waveform and every odd numbered Y electrode and its electronics to a second input waveform or by addressing each waveform alternately in time.

The display is provided with a timebase primarily determined by the sampling rate of the A/D converter 37 and the CCD 35 clock rate. The commencement of sampling and storage may be determined by conventional oscilloscope trigger circuitry (not shown). Vertical expansion or contraction of the displayed waveform may be accomplished by varying the gain setting of the amplifier 33 (as noted above) or the gain of a suitable attenuator (not shown) prior to the amplifier 33.

Horizontal expansion or contraction of the displayed waveform may be accomplished by varing the rate at which data from the RAM 39 is received by the devices which convert waveform amplitude samples into square waves of distinctive phase. In other words, in the case of the FIG. 9 circuit variation of the clocking rate of the gates $SW_1$ to $SW_m$ and in the case of the FIG. 10 circuit variation of the speed of the read-out clock 63 provides the desired horizontal expansion or contraction.

Repetitive or storage modes may be manually selected by a switch (not shown) located in the circuitry of FIG. 9 prior to the RAM 39. The switch passes or inhibits (as appropriate) trigger pulses which cause the input to the RAM 39 to stop and start as and when required.

Vertical shift of the displayed waveform may be accomplished by superimposing a d.c. level on the input signal at the amplifier 33 or, in the storage mode, by shifting the relative phases of the X electrode voltages by a constant amount relative to the step or staircase waveform generated by the waveform generator 43.

Horizontal shift of the displayed waveform may be accomplished by altering the start of the read-out sequence from the RAM 39.

Analogue waveform displays embodying the invention have the potential advantages over conventional CRT displays of compactness, low power consumption, reduced flicker, reduced fading, and legibility in ambient light.

Furthermore storage is not limited by the timebase used (maximum storage writing speed) or the total storage time as with conventional cathode ray storage tubes.

A third example of a circuit for producing a series of square waves having equal amplitude, frequency and pulse width but a relative phase dependent on the amplitude of the analogue waveform to be displayed is shown in FIG. 11.

As before a 100 × 100 matrix liquid crystal display 70 is to be addressed by simultaneous application of waveforms of the same phase to required X, Y electrodes. Since binary elements are used the described circuit has the capability of addressing a 128 × 128 display.

The circuit of FIG. 11 comprises a triggerable 7 bit A/D converter 71 having an input 72 to which waveforms are applied for subsequent display, and an output 73 to a 128 × 7 bit recirculating store 74. A recirculating board control logic unit 75 is connected to both the A/D converter 71 and store 74. Clocking pulses 93, 72 are separately applied to the store 74 from a master clock 76 or the A/D converters 71 internal clock.

The master clock 76 operating at 1MHz has an output 77 connected through a ÷ 128 circuit 78, and a 7 bit binary counter 79 to a first comparator 80. A 128 bit row (x electrodes) shift register 81 is connected to receive clocking pulses 82 from the ÷ 128 circuit 78 and setting pulses 83 (zeros and ones) from the seventh bit output of the 7 bit binary counter 79 i.e. a frequency of $1/128^2$ MHz. The row shift register 81 has 128 parallel outputs 84 of which 100 are connected to each X electrode (not shown) of the display 70. Each X electrode thus receives a square waveform signal of frequency $1/128^2$, the phase difference between waveforms on adjacent electrodes being $2\pi/128$ radians.

An output 85 from the counter 79 is taken through a circuit 86 which adds + 64 to the input of a second comparator 87. The recirculating store 74 output is fed to both comparators 80, 87.

A 128 bit column shift and store bus register 88 has serial input 89 and both a serial 90 and parallel 91 output. Each parallel output channel 91 includes a bistable latch which changes to the value of its associated cell when a strobe pulse 92 is applied from the next output of the ÷ 128 circuit 78. One hundred of the parallel outputs 91 are connected separately to the one hundred Y electrodes (not shown) in the display 70. Clocking pulses 93 are supplied direct from the master clock 76 to the column register 88 and to the store 74.

A gate 94 has three inputs marked A, B, C, and an output D. Gate inputs A, B, C are respectively connected to the output of the first comparator 80 the output of the second comparator 87, and the serial output 90 of the column shift register 88.

The display 70 includes a twisted nematic cell having a typical threshold voltage of about 2 volts, therefore the circuit of FIG. 11 can be implemented with 15 volt CMOS logic without voltage amplifiers e.g. those in FIGS. 9, 10 reference 49.

The A/D converter 71 fulfils the function of converting the analogue input signal into a number of (7-bit binary) digital samples whose numerical value describes the successive analogue values of the input signal at the sampling instants. It also includes controllable gain input amplifiers to define the vertical sensitivity, a timebase control and trigger and arming circuits to define when each recording cycle should be iniated. When the converter 71 is triggered the first 128 successive digital samples are loaded into the recirculating store 74 at a rate determined by the A/D converter clock divided in frequency by an amount determined by its timebase control.

When this sampling frequency is greater than 1/128 MHz the outpus of the recirculating store are disconnected from the rest of the circuitry and the master clock is stopped. After the 128 samples have been loaded into the recirculating store the A/D converter clock is disconnected at 72 and the master clock output 93 reconnected to the store 74. The recirculating store is then clocked by the master clock and its contents read out synchronously into the rest of the circuit as described later.

In the case where the sample frequency is $\leq$ 1/128 MHz) the recirculating store 74 is clocked at the master clock frequency (1 MHz) during the time when it is being loaded and reads out continuously into the rest of the circuitry during this time. This allows the display 70 to continue to display the previously stored waveform which is gradually changed (from left to right) to be replaced by the new waveform represented by the samples being loaded into the recirculating store 74. At the start of the loading sequence when the A/D converter 71 has been triggered a 7 bit counter in the recirculating board control logic 75 is set to zero as the first sample is taken. This is then incremented at the sample rate. A second counter (not shown but in logic 75), incremented at every shift of the recirculating store (i.e. at 1 MHz) has been recording the position of the recirculating store 74 and when, some time later, this counter resets to zero (indicating that the recirculating store 74 is in the home position) the first sample is loaded into the store 74. The store 74 then continues recirculating until at a later time the second sample has been taken and the sample counter incremented to a value of '1'. When the recirculating store counter 74 next reaches the value one the second sample is loaded into the store 74. This loading procedure continues at each coincidence of the sample and store 74 counters, which is detected using a 7 bit comparator (within the logic 75), until the 128th sample has been taken (i.e. sample counter has value 127) and loaded into the store 74. Beyond this point no further samples are loaded into the store 74 until another trigger has occurred. This method ensures that the new samples are loaded in their appropriate places in the store 74 as it recirculates synchronously with the remaining circuitry.

After the store 74 has been filled in one of the two manners described above its contents are read out by the action of clocking pulse 93 from the master clock 76. As each 7 bit word sample is being read out it is compared both with the number in the counter 79 by the first comparator 80, and also compared with the counter 79 number + 64 (by the counter 79 outputs passage through circuit 86) in the second comparator 87. The counter 79 changes its number 1 to 128 once per one complete recirculation of the store 74. During 128 recirculations of the store 74 all possible 7 bit numbers are compared with a number in the first comparator 80 and (64 recirculations later) in the second comparator 87. Thus a particular 7 bit number in the store 74 will cause a pulse from the comparators 80, 87 into the gate 94 at a frequency of $1/128^2$ MHz. The time these pulses occur depends both on the value and position within the store of the 7 bit word; the value of the word determines which counter 79 number it gives coincidence with, and the position within the store 74 determines when, during a complete recirculation of the store 74, it gives coincidence with the counter 79 number.

Simultaneously and synchronously with reading out the store 74 a series of '0' and '1' bits progress along the column shift register 88 and out into the gate 94 at input C. The truth table for this gate is

| A | B | C | D |
|---|---|---|---|
| 1 | 0 | 0 | 0 |
| 1 | 0 | 1 | 0 |
| 0 | 1 | 0 | 1 |
| 0 | 1 | 1 | 1 |
| 0 | 0 | 0 | 0 |
| 0 | 0 | 1 | 1 |

[The state A = 1, B = 1 cannot occur.]

Pulses from the comparators 80, 87 pass through the gate 94 and change the information re-entering and being clocked along the column register 88. Each time the words within the store return to a home position, i.e. after multiples of the 128 master clock pulses 93, a strobe pulse 92 is applied to the column register 88 and may cause a change of output into any of the Y electrodes. The position of a new bit in the column register 88, associated with a pulse from either comparator, is determined by the position of a particular word in the store 74 equal to the instant word in the counter 79. Additionally these changes in the voltage levels applied to the Y electrodes (one 0 one 1) only occur once per 128 strobe pulses 92 at time dependent on the value of that particular word and coincident with the strobe pulse at the end of the appropriate recirculation.

Generally then, if the Nth sample has a value J, the first comparator 80 will give an output when this sample is compared with the counter 79 output during the recirculation of the store 74 in which the counter 79 has the value J. This output from the first comparator 80 will coincide with the Nth bit of the column shift register 88 passing through the gate 94 and will cause this to be re-entered in the shift register 88 as a '0' irrespective of its previous value. Similarly the second comparator 87 will give an output when this sample is compared with the counter 79 output + 64 during the recirculation of the store 74 in which the counter 79 has the value J − 64 or J + 64 i.e. counter 79 output + 64 = J or J + 128). This output from the second comparator 87 will again coincide with the Nth bit of the column shift register 88 passing through the gate 94 and will cause this to be re-entered in the shift register 88 as a '1' irrespective of its previous value. Thus the comparator outputs define the times at which '1' to '0' and '0' to '1' transitions occur on each of the outputs 91 of the column shift register 88 when the strobe pulses are applied and therefore define the phase of the square waves so produced in a manner determined by the numerical values of the stored samples.

A series of square waves for application to the X or row electrodes 84 are as follows. The row register 81 is supplied with a square wave 83 derived from the seventh bit of the counter 79 and is at a frequency of $1/128^2$ MHz. This square wave in the form of '0' and '1' is clocked along the row register 81 at a frequency of 1/128 MHz by the output 82 of the + 128 circuit 78.

Each of the 100 row register outputs 84 connected to the X electrodes are continuously supplying a square waveform of frequency $1/128^2$ MHz with a phase difference between adjacent electrodes of $(2\pi/128)$.

In order to prevent rapid changes of information on the display which could cause the waveform to become invisible if these changes occurred faster then the turn-off response time of the liquid crystal display 70 used a delay (200 msec) may be introduced between triggering the A/D converter 71 and re-arming its the trigger circuit so that the number of display updates per second is limited to a value compatible with the display response times. If the trigger circuit is not re-armed then the system will retain the previously stored information for as long as the power supply is maintained. It can therefore operate either as a refreshed oscilloscope or as a storage oscilloscope.

From the above it can be seen that the A/D converter 71 acts as a sample and digitiser; the counter 79 comparators 80, 87, gate 94, store 74 and column register 88 suitably clocked act as convertors for producing an electrical potential whose phase is representative of each amplitude sample; the bistables within the column register 88 act as first driver devices and the row register 81 suitably clocked and its outputs 84 act as second driver devices.

I claim.

1. An electronic waveform display comprising:
   i. sampling means for dividing the waveform to be displayed into a series of discrete amplitude samples;
   ii. a liquid crystal cell having a layer of liquid crystal material between two dielectric substrates, a first series of $n$ strip electrodes on one substrate and a second series of $m$ strip electrodes on the other substrate arranged to define an nxm plurality of elements across which electric signals may be applied to cause an observable display effect;
   iii. means for producing $m$ different reference electrical signals and for simultaneously applying a different one of said reference signals to each electrode in the second series of electrodes;
   iv. converter means connected between the sampling means and the first series of electrodes for selectively producing ones of the $m$ different reference signals, relative to the order of reference signals applied to the second series of electrodes, the produced signals representing the value of each amplitude samples and for selectively applying such selectively produced signals concurrently to a plurality of the first series of electrodes;
   v. whereby an rms voltage greater than a display effect threshold voltage is maintained across some non-selected liquid crystal elements of the cell so that these elements are in an "on" state and a substantially zero rms voltage exists simultaneously across selected elements which are defined by one electrode of said first series of electrodes and by one electrode of said second series of electrodes to which the same signals are applied so that these elements are in their "off" state and collectively display the waveform.

2. A display according to claim 1 and further comprising means for storing the amplitude samples.

3. A display according to claim 2 wherein the storing means is a random access memory.

4. A display according to claim 2 wherein the storing means includes means for sampling the waveform to be displayed at a higher frequency than the electrical potentials are applicable to the electrodes on the cell.

5. A display according to claim 1 wherein the converter means comprise a plurality of comparators which compare each amplitude sample with a time varying signal from a waveform generator.

6. A display according to claim 2 wherein the converter means comprise means for passing the stored signals into a plurality of counters which are arranged to be synchronously clocked to apply signals to the first series of electrodes.

7. A display according to claim 1 wherein the electrical signals applied to the electrodes on both substrates are rectangular waveforms.

8. A display according to claim 1 wherein the electrical signals applied to the electrodes on both substrates are of sinusoidal form.

9. A display according to claim 1 wherein the sampling means comprises an analogue to digital converter; the converter means comprises a recirculating store, comparators for comparing the contents of the store with a periodically varying number in a counter, a gate for passing the comparator outputs into a shift register having parallel outputs to the first series of electrodes and a serial output to the gate; the converter means comprises latchable bistables connected to the first series of electrodes; and the means for producing reference signals comprises a shift register, along which a square waveform may be clocked, and parallel outputs to the second series of electrodes.

* * * * *